United States Patent [19]
Sasson

[11] Patent Number: 5,388,468
[45] Date of Patent: Feb. 14, 1995

[54] SOLDER WAVE PARAMETERS ANALYZER

[76] Inventor: Shay Sasson, 14, Volfsson St., Rishon Lezion 75201, Israel

[21] Appl. No.: 10,834

[22] Filed: Jan. 29, 1993

[30] Foreign Application Priority Data

Jan. 31, 1992 [IL] Israel ........................... 100838

[51] Int. Cl.⁶ ........................... B23K 1/00; B23K 1/08
[52] U.S. Cl. ........................... 73/865.9; 324/750; 228/56.5
[58] Field of Search ............ 73/865.9; 324/158 F, 324/73.1, 750, 754–758, 760; 228/56.5, 103, 104, 105

[56] References Cited

U.S. PATENT DOCUMENTS

| | | | |
|---|---|---|---|
| 4,180,199 | 12/1979 | O'Rourke et al. | 228/102 |
| 4,206,025 | 6/1980 | Vrancken et al. | 522/163 |
| 4,518,646 | 5/1985 | Niclol, Jr. | 422/248 |
| 4,533,445 | 8/1985 | Orio | 522/83 |
| 4,816,175 | 3/1989 | Lund et al. | 252/171 |
| 5,023,848 | 6/1991 | Frey et al. | 368/1 |
| 5,243,143 | 9/1993 | Throop et al. | 174/263 |
| 5,244,000 | 9/1993 | Stanford et al. | 134/95.1 |

FOREIGN PATENT DOCUMENTS 3001852 11/1980 Germany .
3705081 9/1988 Germany .

*Primary Examiner*—Thomas P. Noland
*Attorney, Agent, or Firm*—Browdy and Neimark

[57] ABSTRACT

An indicator of solder wave soldering parameters includes a simulating board (10) of electrically insulating material provided with a plurality of electrical contact elements (11A, 11B ... 18A, 18B) which are located on a first surface of the board (10) such that, when the board is passed by a soldering machine conveyor over a solder wave with the contact elements facing the wave, at least some of them will be immersed in the solder to different depths so as to form an electric contact between them, each of the electrical contact elements being associated with an electronic measuring circuit (31, 33) adapted to measure and record the specific depth and duration of the electrical contact between each such contact element and the solder wave thereby simulating the corresponding dwell time and specific depth of penetration of the solder wave into contact orifices of a real printed circuit plate.

17 Claims, 4 Drawing Sheets

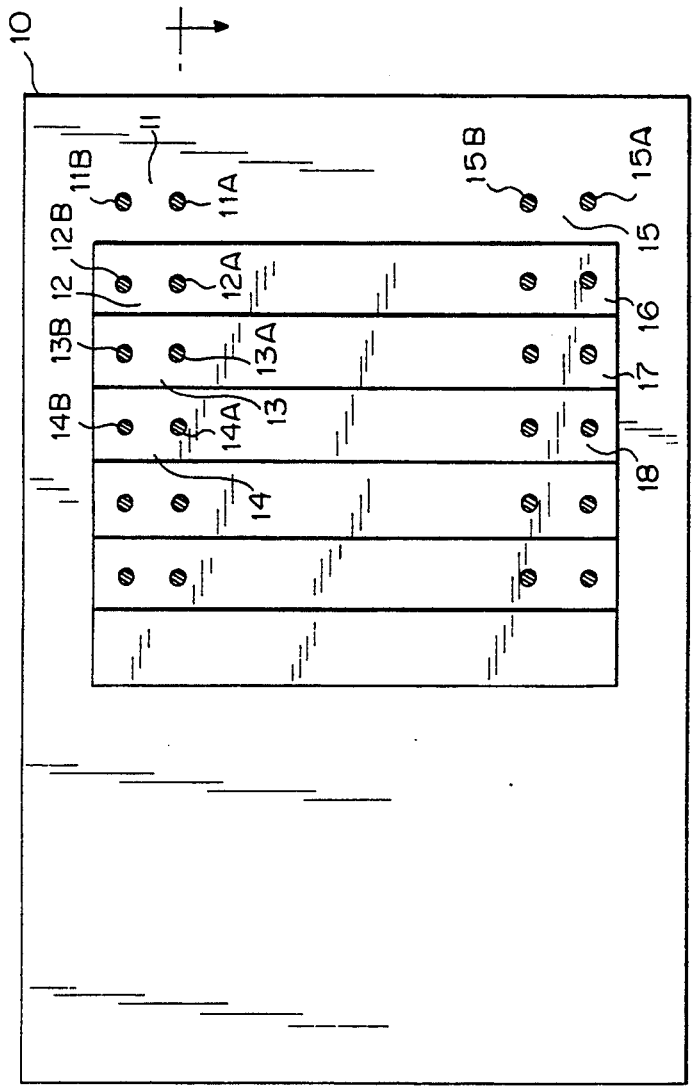
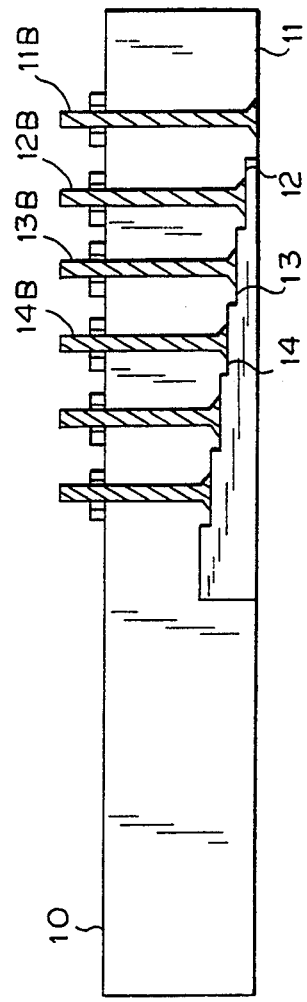
FIG. 1A
FIG. 1B

SOLDER WAVE PARAMETERS ANALYZER

BACKGROUND OF THE INVENTION

1. Field of the Invention

The present invention relates generally to wave soldering control apparatus and, more particularly, to an apparatus for simultaneous measuring and checking several parameters of a solder contact, which could be provided by the solder wave when soldering a device like a printed circuit card.

2. Description of the Prior Art

Where it is necessary to provide soldering of a large number of electrical, electronic components, subsystems or systems such as on a printed circuit card, for example, it is not practical to execute this by a point-to-point manual soldering technique. Instead, such large number of connections are soldered together by an apparatus operating on what is referred to as a "wave" soldering principle. In a wave soldering machine, a printed circuit board to be soldered is moved by a conveyor through an enclosure on an inclined path past a fluxing station, a preheating station, and, at the end, a soldering station at which a wave of solder is caused to well upwardly and contact the various parts to be soldered. One of the most important parameters for insuring efficient and reliable soldering connections, is the dwell time of the devices to be soldered in the soldering wave.

In the prior art, one of the known techniques for measuring dwell time was by indirect means, in which a wave "footprint" measurement device was used and a plot was developed from empirical data. Specifically, a glass plate, having a set of grid lines of known dimensions is passed along the wave soldering machine conveyor and the contact of the solder wave is measured by the eye counting grid squares or lines of contact. Thus, it is a simple matter of calculating the dwell time by multiplying the thickness of the wave as measured on the plate by 60 seconds per minute and dividing by the conveyor speed in centimeters per minute, for example.

Although this technique is accurate, it leaves much to be desired in that for a number of different reasons the dwell time can change quickly. For example, there is an undesirable effect termed "drag-out", that may result from the wetting ability of the materials used, and the component lead configuration, in which the solder wave is pulled out of shape as the solder joints leave the wave. When this happens, the dwell time for certain joints will be significantly longer than for others. As the glass plate is not wetted by the solder, the known "footprint" technique does not indicate the presence of drag-out.

U.S. Pat. No. 5,023,848 provides a solder dwell time measurement means (timer) which operates automatically, does not rely upon human observational techniques and calculations, and can exhibit the presence of drag-out. The timer comprises a pair of spaced apart probes generally approximating the contact geometry of a conveyed object to be wave soldered. It is similarly conveyed past and in contact with the solder wave. A timing circuit interconnects with the probes and measures the dwell time of the pair of probes in contact with the solder wave. The probes' contacting parts may have shapes of linear edges or points.

The disadvantages of the described device are as follows. Despite the fact, that the dwell time is an important parameter of the wave soldering process, there are several other paramaters which must be defined and taken into account before starting the working process. Such a parameter, for example, is the depth of penetration of the solder wave into the contact orifices of the printed circuit. The other parameter is parallelity of the printed board when conveyed over the solder wave. This parameter has a strong influence on the quality of the soldered printed board.

It is therefore the object of the present invention to provide an ellaborated indicator of the solder wave process parameters, such parameters being the dwell time, the depth of penetration of the solder wave into the contact orifices of a board and the parallelity of the board on the conveyor.

SUMMARY OF THE DISCLOSURE

The indicator of solder wave soldering parameters, herein provided, comprises a simulating board to be passed by the soldering machine conveyor along the solder wave; and said board is provided with a plurality of contact orifices; and said plurality is divided into several groups of orifices, which groups are placed on different sections of said board; and said sections have different thicknesses; and each of said groups is electrically connected to a corresponding timer; so that, when said simulating board is moved along said solder wave, said groups of contact orifices come into contact with said solder wave according to their height level relating to said solder wave's height and hence relating to the depth of penetration of said solder wave into said contact orifices; and the duration of the contact between said specific group of contact orifices and said solder wave can be measured as the corresponding dwell time for the specific depth of penetration of the solder wave into said specific group of contact orifices.

In the preferred embodiment said simulating board is provided with an additional plurality of said contact orifices; and said two pluralities are placed on both sides of said board; and at least one of said pluralities is divided into groups of contact orifices, which groups are placed on said sections, having different height levels; and at least two of said groups, belonging correspondingly to said two different pluralities, are placed on two sections, having the same thickness; so that the measurements provided by said timers of said corresponding groups of contact orifices may be compared in order to check the parallel position of said board relating to said solder wave.

In the preferred embodiment said two pluralities are parallel to each other.

In the preferred embodiment said sections of said board form a stairs-like shape on the lower surface of said board.

In an alternative embodiment said sections of said board form an inclined surface on the lower surface of said board.

In the preferred embodiment each of said timers is controlled by a stopper; and each of said timers is put on at the time when said solder wave comes into touch with said corresponding group of contact orifices; and each of said timers is stopped, when said solder wave leaves the contact with said group of contact orifices.

In the preferred embodiment each of said groups comprises two contact orifices, connected to said stopper corresponding to said group.

In one preferred embodiment the thicknesses of said adjacent sections of said board differ from each other by about 0.2 mm.

In one preferred embodiment said two pluralities of said contact orifices are spaced from each other at a distance of about 15-20 cm.

In the preferred embodiment said stopper's electronic circuit comprises a field effect transistor (FET).

In the preferred embodiment said timer is a timer of an electronic watch.

In the preferred embodiment said simulating board is provided with means for measuring a preheating temperature of said board at any desired moment.

DESCRIPTION OF THE DRAWINGS

FIG. 1A demonstrates a plan view of a simulating board.

FIG. 1B illustrates a longitudinal cross section of the simulating board shown in FIG. 1A.

DESCRIPTION OF A PREFERRED EMBODIMENT

Figure 2:
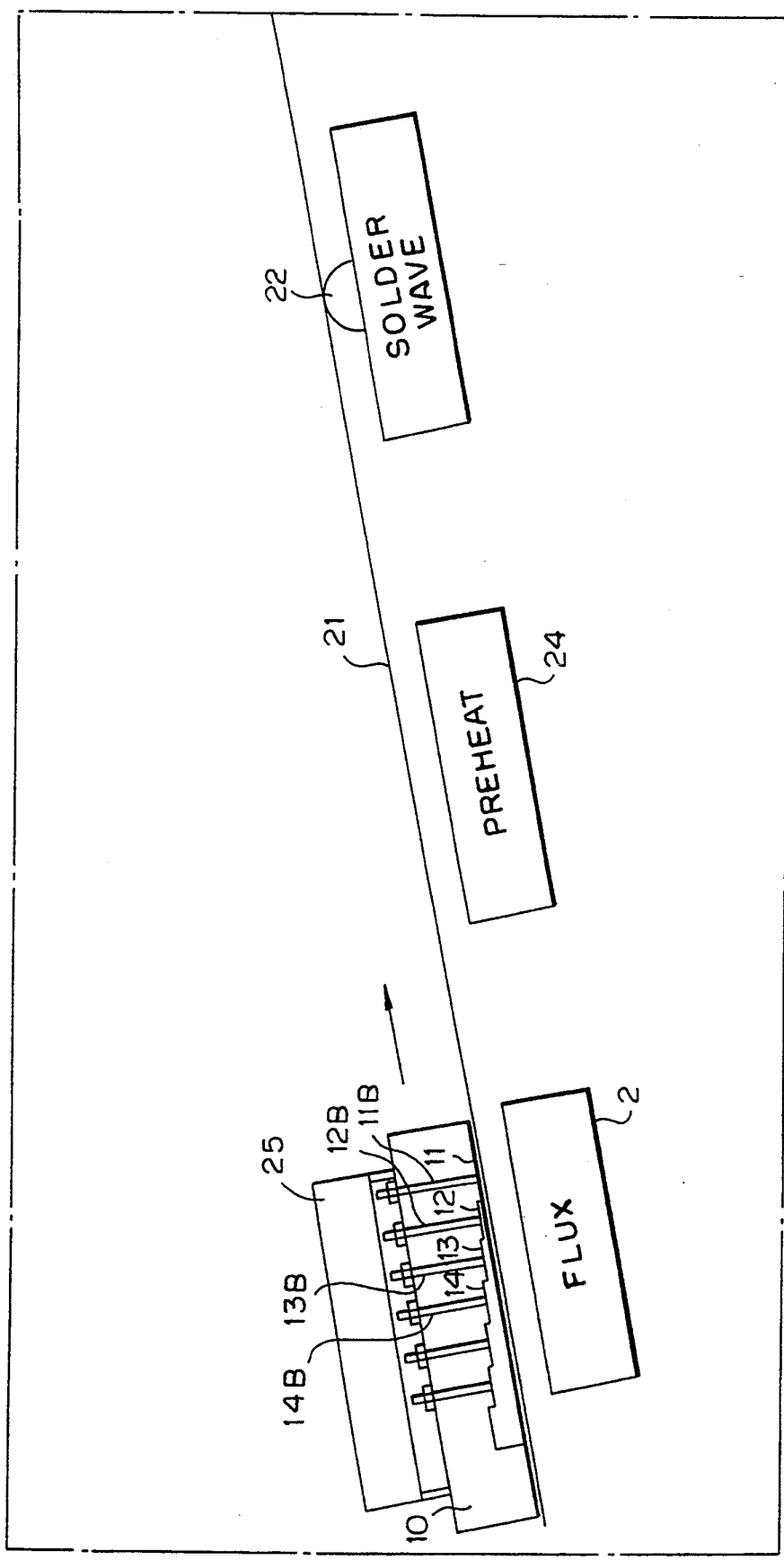
FIG. 2 illustrates schematically conveyor of a soldering machine, carrying the simulating board towards the solder wave.

In FIGS. 1A,B a simulating board 10 is illustrated. The board 10 is made of the same material, as that of the printed circuit plates intended to be soldered by the soldering machine. Several sections 11,12,13,14, having different thicknesses are provided at the surface of one edge of the board 10. A plurality of contact orifices 11A,B, 12A,B, 13A,B, 14A,B is distributed correspondingly along the adjacent sections 11-14. A section 15, having the same thickness as the section 11, is situated on the opposite side of the board 10. As shown in this particular case, the two sections 11 and 15 form a common surface having the same thickness. The section 15 is provided with two contact orifices 15A and 15B. The distance between the contact orifices 11A,B and 15A,B is about 15 cm. Optionally, the board 10 is provided with an additional group of sections 16,17,18, and this group could be placed parallelly to the group of the sections 11,12,13,14.

In FIG. 1B the longitudinal cross section of the simulating board 10 demonstrates four (optionally, more) sections 11,12,13,14, having different thicknesses. They form a staircase-like line. It is practical, that the first section 11 has the thickness equal to the thickness of the board 10 (and equal to a regular printed circuit board's thickness), so that its level is marked with 0.0 mm. The following section 12 has the level of 0.2 mm higher than the section's 11 level, thus the section's 12 level is marked with 0.2 mm. By analogy with that, the section's 13 level is 0.4 mm, and the section's 14 level is 0.6.

Electrical contacts, placed in the contact orifices 11B, 12B, 13B and 14B are marked with the same symbols as the contact orifices.

In FIG. 2 a conveyor 21 of a soldering machine is shown, carrying the simulating board 10 towards the solder wave 22 (the perpendicular cross section of the wave 22 is seen). A fluxing station 23 and a preheating station 24 are shown, being placed before the solder wave 22. The contacts 11-14A and 11-14B (see FIG. 1A) of the simulating board 10 are positioned on the different levels of the board, and are connected to corresponding circuits of measuring means 25. These contacts can therefore indicate the height of the wave 22, the depth of penetration of the solder wave 22 into the specific contact orifices, and the duration of the contact (dwelling time, or penetration time). In this particular case the measuring means 25 is a stopper and timer unit (see FIG. 3), reacting to the presence of an electrical contact and to its duration on each pair of contacts orifices (11A,B; 12A,B . . . ).

In this particular case, when the simulating board 10 moves along the solder wave 22, the wave 22 comes into contact with the sections 11,12,13 one after the other. If, for Instance, the height of the wave 22 is enough to reach a contact with the sections 11,12 and 13 (but not with section 14), then the last contact orifices, which are able to register the electrical contact with the solder wave 22, will be the contact orifices 13A and B. In the same sequence of time, the corresponding stopper and timer circuits of the unit 25 will be energized through the specific contact orifices coming in touch with the solder wave 22. Then the last energized circuit will be the circuit, corresponding to the contact orifices 13A,B of section 13. (The circuits of the unit 25 are shown in detail in FIG. 3). The last energized stopper and timer circuit will indicate the solder wave's 22 height. In this particular case the timer, marked with the corresponding section's 13 level "0.4 mm" will define the wave's height 0.4 mm above the 0.0 mm level. Hence, the depth of penetration of that specific solder wave into contact orifices provided in an actual printed circuit board, will also be approximately 0.4 mm, provided that the position of the printed board above the wave 10 is unchanged.

For each of the sections 11, 12, 13 the duration of the contact is registered by the corresponding timers. This parameter reflects the dwell time (time of penetration) for the specific level (depth of penetration).

The operator or a control system can analyze the readings of the dwell time and the depth of penetration. Based on this information, the operator or the control system can regulate the position of the actual printed circuit board above the wave, or the height of the wave in order to obtain the desired quality of soldered contacts for each specific case.

Such an operation is necessary
a) for adjusting the board's position before starting a soldering process for a new batch of printed boards;
b) for periodical control of the soldering machine's parameters.

The operator or a control system should also take into account the parallelity test, accomplished by the simulating board. The board is parallel, if at least two measurements provided by means of the contact orifices 11A,B and 15A,B, are equal to each other.

If the two above mentioned measurements are not equal to each other, the balance of the soldering machine should be corrected.

Figure 3:
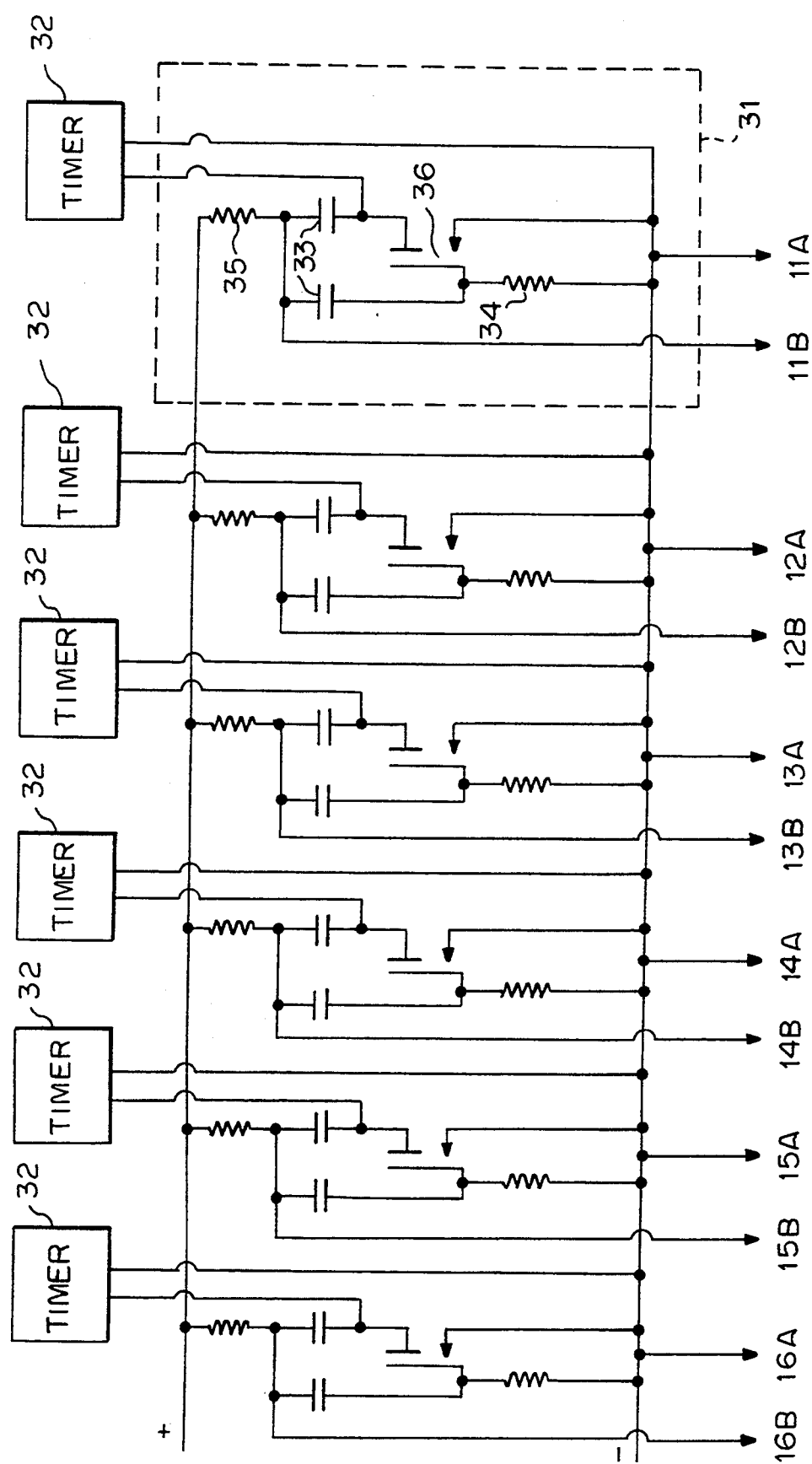
FIG. 3 illustrates a block-diagram of a unit containing electronic measuring means.

In FIG. 3 a plurality of electronic stoppers and timers is shown, being contained in the measuring means unit 25. Each pair of the simulating board contacts 11A,B, 12 A,B, 15A,B and others ape provided with a stopper circuit 31, and its output is connected to the input of a timer 32. The voltage of the energy supply is about 6-9 V. In this particular case the timers 32 are regular watch timers. Each stopper circuit 31 includes an input, connected to the certain contact orifices A,B on the board 10, two equal capacitors 33, two resistors 34 and 35, and a FET transistor 36. The output from the transistor 36 is connected to an input of the timer 32. The specific stopper circuit 31 produces a starting signal at the moment when the specific electrical contacts A,B come into touch with the solder wave 22; and, in addition, the stopper circuit provides a stopping signal at the moment when the solder wave leaves the electrical contacts A,B. These starting and stopping signals enable the timer 32 to register the exact time of the solder wave's presence at the specific level (in other words, "dwell time").

The measuring means unit 25 may optionally comprise comparing means for checking the parallelity of the simulating board by means of comparing two specific measurements provided on the two different edges of the board.

The unit 25 can also be provided with means for measuring a preheating temperature of the board at any desired time.

Figure 4:
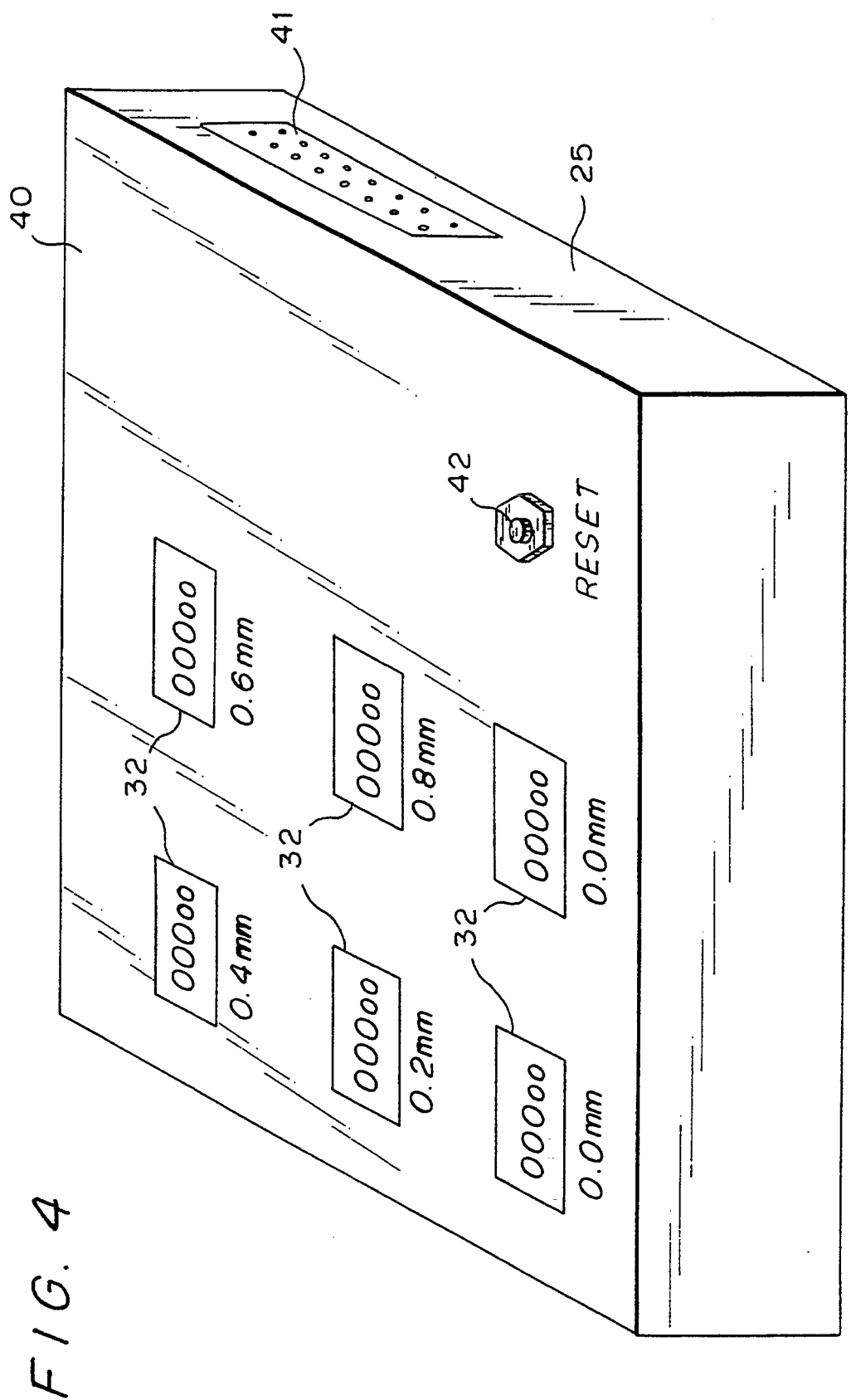
FIG. 4 illustrates a three dimensional view of the upper signal panel of the measuring unit.

FIG. 4. All the necessary results of measurements and comparison can be indicated on an upper signal panel 40 of the measuring means unit 25. In this particular case the panel 40 comprises the timers' screens 32, marked with corresponding levels "0.0 mm", "0.2 mm", . . . of the simulating board 10. Two timers, marked with "0.0 mm" are provided to compare their readings corresponding to the two different edges of the board, and to check the board's parallelity. A contact set 41 connects the contact orifices, placed on the simulating board 10, to the measuring means unit 25. An electrical push-button 42 is intended to be used for resetting the electronic timers of the signal panel 40 before starting any new measurements.

While the invention has been described, it should be appreciated that other similar embodiments of the simulating board can be suggested for accomplishing the same principle of the solder wave's parameters analysis.

What is claimed:

1. An indicator of solder wave soldering parameters, comprising a simulating board of electrically insulating material provided with a plurality of electrical contact elements or groups of elements, said elements or groups of elements being located on a first surface, said board such that, when the board is passed by a soldering machine conveyor over a solder wave with said contact elements facing said wave, at least some of them will be immersed in the solder to different depths therein, so as to form an electric contact between them, each of said electrical contact elements or groups of elements being associated with an electronic measuring circuit, adapted to measure and record the specific depth and duration of the electrical contact between each said contact element (or group of elements), and said solder wave thereby simulating the corresponding dwell time and specific depth of penetration of said solder wave into contact orifices of a real printed circuit plate.

2. The indicator of solder wave soldering parameters as in claim 1, wherein said simulating board is provided with means for measuring a preheating temperature of said board.

3. An indicator of solder wave soldering parameters, comprising a simulating board of electrically insulating material provided with a plurality of electrical contact elements or groups of elements, said elements or groups of elements being located on a first surface, said board such that, when the board is passed by a soldering machine conveyor over a solder wave with said contact elements facing said wave, at least some of them will be immersed in the solder to different depths therein, so as to form an electric contact between them, each of said electrical contact elements or groups of elements being associated with an electronic measuring circuit, adapted to measure and record the specific depth and duration of the electrical contact between each said electrical contact element (or group of elements) and said solder wave thereby simulating the corresponding dwell time and specific depth of penetration of said solder wave into contact orifices of a real printed circuit plate, each of said electrical contact elements is located on a separate section of said first surface of said simulating board, each said separate sections having different thicknesses.

4. The indicator according to claim 3, wherein said electrical contact elements are situated in a plurality of orifices of corresponding bores provided in said simulating plate, and terminate on said first surface.

5. The indicator of solder wave soldering parameters as in claim 3, wherein said sections of said board form a stairs-like shape on the first surface of said board.

6. The indicator of solder wave soldering parameters as in claim 3, where in said sections of said board form an inclined surface on the first surface of said board.

7. The indicator of solder wave soldering parameters as in claim 3, wherein said thicknesses of said adjacent sections of said board differ apart by about 0.2 mm.

8. An indicator of solder wave soldering parameters, comprising a simulating board of electrically insulating material provided with a plurality electrical contact elements or groups of elements, said elements or groups of elements being located on a first surface, said board such that, when the board is passed by a soldering machine conveyor over a solder wave with said contact elements facing said wave, at least some of them will be immersed in the solder to different depths therein, so as to form an electric contact between them, each of said electrical contact elements or groups of elements being associated with a respective electronic measuring circuit, comprising a timer, adapted to measure and record the specific depth and duration of the electrical contact between each said electrical contact element (or group of elements), and said solder wave thereby simulating the corresponding dwell time and specific depth of penetration of said solder wave into contact orifices of a real printed circuit plate.

9. The indicator of solder wave soldering parameters as in claim 8, wherein said simulating board is provided with a second plurality of electrical contact elements; said two pluralities of electrical contact elements being placed on both sides of said board; and at least one of said pluralities is divided into groups of electrical contact elements, said groups of electrical contact elements being placed on said sections, having different height levels; at least two of said groups of electrical contact elements, belonging correspondingly to said two pluralities of electrical contact elements, are placed on two sections having the same thickness; so that the measurements provided by said timers relating to corresponding said groups of electrical contact elements may be compared in order to check the parallel position of said board relating to said solder wave.

10. The indicator of solder wave soldering parameters as in claim 9, wherein said two pluralities of electrical contact elements are parallel to each other.

11. The indicator of solder wave soldering parameters as in claim 10, wherein said sections of said board form a stairs-like shape on the first surface of said board.

12. The indicator of solder wave soldering parameters as in claim 10, wherein said sections of said board form an inclined surface on the first surface of said board.

13. The indicator of solder wave soldering parameters as in claim 9, wherein said sections of said board form a stairs-like shape on said first surface of said board.

14. The indicator of solder wave soldering parameters as in claim 9, wherein said sections of said board form an inclined surface on the first surface of said board.

15. The indicator of solder wave soldering parameters as in claim 9, wherein said two pluralities of said contact orifices are spaced apart at a distance of about 15-20 cm.

16. The indicator of solder wave soldering parameters as in claim 8, wherein each of the timers is controlled by a stopper; and each of said timers is put on at the time when said solder wave comes into touch with the corresponding said group of electrical contact elements; and each of said timers is stopped, when said solder wave leaves the contact with said group of contact elements.

17. The indicator of solder wave soldering parameters, as in claim 16, wherein each of said groups of electrical contact elements comprises two contact elements, connected to said stopper corresponding to each said group of electrical contact elements.

* * * * *